United States Patent [19]
Gardner et al.

[11] Patent Number: 6,004,849
[45] Date of Patent: Dec. 21, 1999

[54] METHOD OF MAKING AN ASYMMETRICAL IGFET WITH A SILICIDE CONTACT ON THE DRAIN WITHOUT A SILICIDE CONTACT ON THE SOURCE

[75] Inventors: Mark I. Gardner, Cedar Creek; Daniel Kadosh; Michael Duane, both of Austin, all of Tex.

[73] Assignee: Advanced Micro Devices, Inc., Sunnyvale, Calif.

[21] Appl. No.: 08/911,745

[22] Filed: Aug. 15, 1997

[51] Int. Cl.[6] .................................................. H01L 21/265
[52] U.S. Cl. ............................................ 438/286; 438/305
[58] Field of Search .................................. 438/286, 179, 438/966, 911, 303, 305, 307

[56] References Cited

U.S. PATENT DOCUMENTS

| | | | |
|---|---|---|---|
| 4,225,875 | 9/1980 | Ipri .......................................... | 257/353 |
| 4,272,881 | 6/1981 | Angle ....................................... | 438/284 |
| 4,329,186 | 5/1982 | Kotecha et al. ........................ | 438/286 |
| 4,356,622 | 11/1982 | Widmann ................................ | 438/291 |
| 4,927,777 | 5/1990 | Hsu et al. ............................... | 438/305 |
| 5,073,514 | 12/1991 | Ito et al. ................................. | 438/305 |
| 5,132,753 | 7/1992 | Chang et al. ........................... | 257/655 |
| 5,171,700 | 12/1992 | Zamanian ............................... | 438/305 |
| 5,200,358 | 4/1993 | Bollinger et al. ....................... | 438/631 |
| 5,296,398 | 3/1994 | Noda ....................................... | 438/179 |
| 5,342,798 | 8/1994 | Huang ..................................... | 438/305 |
| 5,349,225 | 9/1994 | Redwine et al. ........................ | 257/336 |
| 5,364,807 | 11/1994 | Hwang .................................... | 438/286 |
| 5,366,915 | 11/1994 | Kadama .................................. | 438/257 |
| 5,397,715 | 3/1995 | Miller ..................................... | 438/268 |
| 5,424,234 | 6/1995 | Kwon ...................................... | 438/305 |
| 5,436,482 | 7/1995 | Ogoh ....................................... | 257/344 |
| 5,444,024 | 8/1995 | Anjum et al. ........................... | 438/528 |
| 5,446,018 | 8/1995 | Yost et al. . | |
| 5,451,807 | 9/1995 | Fujita ...................................... | 257/404 |
| 5,510,279 | 4/1996 | Chien et al. ............................. | 438/302 |
| 5,512,503 | 4/1996 | Hong ....................................... | 438/306 |
| 5,518,940 | 5/1996 | Hodate et al. .......................... | 438/151 |
| 5,521,417 | 5/1996 | Wada ...................................... | 257/390 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61-194777 | 8/1986 | Japan . |
| 61-194777 | 1/1987 | Japan . |
| 1-18762 | 1/1992 | Japan . |
| 08078672 | 3/1996 | Japan . |

OTHER PUBLICATIONS

IBM Technical Disclosure Bulletin, "Process for Making Very Small, Asymmetric, Field–Effect Transistors", vol. 30, No. 3, Aug. 1987, pp. 1136–1137 (XP 000671026).

IBM Technical Disclosure Bulletin, "Low SeriesResistance Source by Spacer Methods", vol. 33, No. 1A, Jun. 1, 1990, pp. 75–77 (XP 000120044).

*Primary Examiner*—Savitri Mulpuri
*Attorney, Agent, or Firm*—Skjerven, Morrill, MacPherson, Franklin & Friel, L.L.P.; William W. Holloway

[57] ABSTRACT

A method of making an asymmetrical IGFET is disclosed. The method includes providing a semiconductor substrate with an active region, wherein the active region includes a source region and a drain region, forming a gate insulator on the active region, forming a gate on the gate insulator and over the active region, implanting arsenic into the active region to provide a greater concentration of arsenic in the source region than in the drain region, growing an oxide layer over the active region, wherein the oxide layer has a greater thickness over the source region than over the drain region due to the greater concentration of arsenic in the source region than in the drain region, forming a source in the source region and a drain in the drain region, depositing a refractory metal over the gate, the source, the drain, and the oxide layer, and reacting the refractory metal with the drain without reacting the refractory metal with the source, thereby forming a silicide contact on the drain without forming a silicide contact on the source. Advantageously, the IGFET has low source-drain resistance, shallow channel junctions, and an LDD that reduces hot carrier effects.

7 Claims, 3 Drawing Sheets

U.S. PATENT DOCUMENTS

| | | | |
|---|---|---|---|
| 5,525,552 | 6/1996 | Huang | 438/297 |
| 5,547,885 | 8/1996 | Ogoh | 438/286 |
| 5,547,888 | 8/1996 | Yamazaki | 438/279 |
| 5,550,084 | 8/1996 | Anjum et al. | 438/683 |
| 5,578,509 | 11/1996 | Fujita | 438/286 |
| 5,585,293 | 12/1996 | Sharma et al. | 438/261 |
| 5,585,658 | 12/1996 | Mukai et al. | 257/344 |
| 5,591,650 | 1/1997 | Hsu et al. | 438/154 |
| 5,607,869 | 3/1997 | Yamazaki | 438/286 |
| 5,648,286 | 7/1997 | Gardner et al. | 438/286 |
| 5,654,215 | 8/1997 | Gardner et al. | 438/286 |
| 5,656,518 | 8/1997 | Gardner et al. | 438/286 |
| 5,672,531 | 9/1997 | Gardner et al. | 438/305 |
| 5,677,224 | 10/1997 | Kadosh et al. | 257/336 |
| 5,744,371 | 4/1998 | Kadosh et al. | 438/305 |
| 5,759,897 | 6/1998 | Kadosh et al. | 438/286 |
| 5,766,997 | 6/1998 | Takeuchi | 438/257 |
| 5,770,485 | 6/1998 | Gardner et al. | 438/162 |
| 5,851,891 | 12/1998 | Dawson et al. | 438/305 |
| 5,874,340 | 2/1999 | Gardner et al. | 438/286 |

METHOD OF MAKING AN ASYMMETRICAL IGFET WITH A SILICIDE CONTACT ON THE DRAIN WITHOUT A SILICIDE CONTACT ON THE SOURCE

BACKGROUND OF THE INVENTION

Field of the Invention

The present invention relates to integrated circuit manufacturing, and more particularly to a method of making insulated-gate field-effect transistors.

Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystine silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to the gate. The spacers are typically oxides or nitrides. The purpose of the lighter dose is to form a lightly doped region of the drain (or LDD) at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics. A known fabrication sequence includes forming lightly doped source/drain regions, forming the spacers, and then forming heavily doped source/drain regions. Another known fabrication sequence includes forming disposable spacers, forming heavily doped source/drain regions, removing the disposable spacers, and then forming lightly doped source/drain regions (between the heavily doped source/drain regions and the gate).

Disadvantages of LDDs include increased fabrication complexity and increased parasitic resistance due to their light doping levels. During operation, LDD parasitic resistance decreases drain current. Linear drain current (in the linear or triode region) is reduced by the parasitic resistance in both the source and drain. Saturation drain current (in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, forming a single spacer on the drain side using liquid phase deposition (LPD) of silicon dioxide, stripping the photoresist, and implanting heavily doped source and drain regions using the gate and single spacer as an implant mask.

A drawback to conventional asymmetrical IGFETs is that typically the heavily doped source and drain regions are the most heavily doped regions of the source and drain and have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces source-drain series resistance, thereby improving drive current.

Providing low resistance contacts for the gate, source and drain can be accomplished using refractory metal silicide. In one approach, a thin layer of refractory metal is deposited over the structure after forming the lightly and heavily doped source/drain regions and the spacers, and heat is applied to form silicide contacts wherever the refractory metal is adjacent to silicon (including single crystal silicon and polysilicon). Thereafter, an etch is applied that removes unreacted refractory metal over the spacers to prevent bridging silicide contacts for the gate, source and drain. Various silicides such as titanium silicide ($TiSi_2$), tungsten silicide ($WSi_2$), molybdenum silicide $MoSi_2$), cobalt silicide ($CoSi_2$) and tantalum silicide ($TaSi_2$) have been used for this purpose. For instance, the sheet resistance of titanium silicide is as low as 3 to 6 $\Omega$/sq, whereas heavily doped polysilicon exhibits a sheet resistance on the order of 15 to 30 $\Omega$/sq. Another advantage to this approach is that the silicide contacts for the gate, source and drain are formed simultaneously and are self-aligned by the spacers. This self-aligned silicide is sometimes referred to as "salicide."

A drawback of silicide contacts is that the reaction between the refractory metal and the silicon consumes a considerable amount of silicon. For instance, if titanium silicide contacts are desired, a typical thickness for the deposited titanium layer is about 200 angstroms, and after applying a thermal cycle, the ensuing titanium silicide contacts have a thickness of about 500 angstroms, and the reaction consumes about 400 angstroms of the source and drain. Thus, the ratio of titanium silicide to the original titanium is about 2.5 to 1, and although the theoretical ratio of the consumed silicon to the original titanium is reported as about 2.3 to 1, Applicants find that in actual practice this ratio is about 2 to 1.

A strategy for enhancing IGFET performance is to have the dopant atoms in the source and drain as close to the surface of the substrate as possible. Restricting current flow to a very narrow layer between the source and drain tends to improve current drive properties, and also reduce off-state leakage current. Accordingly, as IGFET dimensions are reduced, it is highly desirable to form the source and drain with shallow channel junctions on the order of 100 to 1500 angstroms deep in order to improve device performance. Unfortunately, when silicide contacts are formed on a shallow source and drain, the silicide reaction can consume a substantial portion of the source and drain, thereby degrading device performance or leading to device failure.

In the case of symmetrical IGFETs, the lightly doped source and drain regions can be implanted to relatively shallow depths to provide shallow channel junctions, and the heavily doped source and drain regions (which are displaced from the channel junctions) can be implanted to relatively large depths to accommodate the subsequent silicide reaction. In the case of asymmetrical IGFETs, however, the source typically consists of a heavily doped source region implanted with a single implant step. This creates difficulties if both shallow channel junctions and source/drain silicide contacts are desired. That is, as the source becomes shallower to provide a shallower channel junction, the source becomes less able to accommodate the silicide reaction. In this manner, the suicide reaction places constraints on the source.

U.S. Pat. No. 5,648,286 entitled "Method of Making Asymmetrical Transistor with Lightly Doped Drain Region, Heavily Doped Source and Drain Regions, and Ultra-Heavily Doped Source Region" by Gardner et al. discloses an asymmetrical IGFET in which the source includes heavily and ultra-heavily doped source regions, and the drain includes lightly doped and heavily doped drain regions. The heavily doped source region and the lightly doped drain region provide channel junctions, and the ultra-heavily doped source region and the heavily doped drain region are displaced from the channel junctions. Advantageously, the ultra-heavily doped source region can accommodate a silicide reaction while the heavily doped source region provides a shallow channel junction. However, in some instances, it might be desirable for the ultra-heavily doped source region to be shallower in order to provide even lower source-drain resistance, in which case the ultra-heavily doped source region may become too shallow to accommodate the silicide reaction.

Accordingly, a need exists for an improved IGFET that has low source-drain resistance, shallow channel junctions, and an LDD to reduce hot carrier effects.

SUMMARY OF THE INVENTION

An object of the invention is to provide a high-performance, asymmetrical IGFET that fulfills the need in the art described above. Generally speaking, this is accomplished by forming a silicide contact on the drain without forming a silicide contact on the source. Applicant has observed that in asymmetrical IGFETs, in which a heavily doped source region provides a channel junction, a silicide contact on the source provides no appreciable improvement in device performance (such as speed and drive current). As a result, by protecting the source from the silicide reaction, the source can be formed with the desired dimensions and doping concentration, whether or not the source can accommodate the silicide reaction.

In accordance with one aspect of the invention, a method of making an asymmetrical IGFET includes providing a semiconductor substrate with an active region, wherein the active region includes a source region and a drain region, forming a gate insulator on the active region, forming a gate on the gate insulator and over the active region, implanting arsenic into the active region to provide a greater concentration of arsenic in the source region than in the drain region, growing an oxide layer over the active region, wherein the oxide layer has a greater thickness over the source region than over the drain region due to the greater concentration of arsenic in the source region than in the drain region, forming a source in the source region and a drain in the drain region, depositing a refractory metal over the gate, the source, the drain, and the oxide layer, and reacting the refractory metal with the drain without reacting the refractory metal with the source, thereby forming a silicide contact on the drain without forming a silicide contact on the source.

Preferably, the method includes the sequential steps of forming the gate, forming a masking layer that covers the drain region and includes an opening above the source region, implanting the arsenic to form a heavily doped source region in the source region using the masking layer as an implant mask for the drain region, removing the masking layer, growing the oxide layer, implanting a lightly doped drain region in the drain region using the oxide layer as an implant mask for the source region, forming first and second spacers on the oxide layer and in close proximity to opposing sidewalls of the gate, wherein the first spacer is over the source region and the second spacer is over the drain region, implanting a heavily doped drain region in a portion of the drain region outside the second spacer, and depositing the refractory metal on the oxide layer and the spacers.

The heavily doped drain region can be implanted with sufficiently low energy that the oxide layer provides an implant mask for the portion of the source region outside the first spacer, in which case the arsenic provides essentially all doping for the source which consists of the heavily doped source region. Alternatively, the heavily doped drain region can be implanted with sufficiently high energy that the oxide layer does not provide an implant mask for the portion of the source region outside the first spacer, in which case an ultra-heavily doped source region is formed in the portion of the source region outside the first spacer, and the source consists of the heavily and ultra-heavily doped source regions.

As exemplary materials, the gate is polysilicon, the gate insulator is silicon dioxide, the spacers are silicon nitride, the masking layer is photoresist, the refractory metal is titanium, and the silicide contact is titanium silicide.

Advantageously, the IGFET has low source-drain resistance, shallow channel junctions, and an LDD to reduce hot carrier effects. Another advantage is that the dimensions and doping profile of the source need not be constrained by a silicidation process that forms a silicide contact for the drain. A further advantage is that the IGFET can be formed with relatively few processing steps, using a conventional silicidation process in which the refractory metal need not be selectively deposited or selectively etched.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
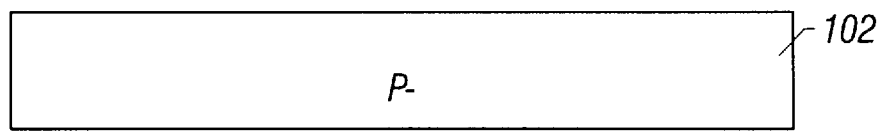
FIGS. 1A–1M show cross-sectional views of successive process steps for making an asymmetrical IGFET with a silicide contact on the drain without a silicide contact on the source in accordance with a first embodiment of the invention.

In the drawings, depicted elements are not necessarily drawn to scale and like or similar elements may be designated by the same reference numeral throughout the several views.

In FIG. 1A, a silicon substrate suitable for integrated circuit manufacture is provided. The substrate includes a P-type epitaxial surface layer disposed on a P+ base layer (not shown). The epitaxial surface layer has a boron background concentration on the order of $1\times10^{15}$ atoms/cm$^3$, a <100> orientation and a resistivity of 12 ohm-cm. Active region 102 of the epitaxial surface layer is shown. For convenience of illustration, dielectric isolation such as LOCOS or trench oxides between active region 102 and adjacent active regions in the substrate is not shown.

A well implant, punchthrough implant, and threshold adjust implant are applied sequentially into active region 102. The well implant is provided by subjecting the structure to ion implantation of boron at a dose in the range of $1\times10^{12}$ to $1\times10^{13}$ atoms/cm$^2$ and an energy in the range of 100 to 170 kiloelectron-volts, the punchthrough implant is provided by subjecting the structure to ion implantation of boron at a dose in the range of $1\times10^{12}$ to $1\times10^{13}$ atoms/cm$^2$ and an energy in the range of 40 to 100 kiloelectron-volts, and the threshold adjust implant is provided by subjecting the structure to ion implantation of boron at a dose in the range of $1\times10^{12}$ to $1\times10^{13}$ atoms/cm$^2$ and an energy in the range of 2 to 30 kiloelectron-volts. Active region 102 continues to be doped P- with an increased boron background concentration on the order of about $1\times10^{16}$ atoms/cm$^3$.

Well implants, punchthrough implants, and threshold adjust implants are often used in the fabrication of IGFETs. The well implant provides a more uniform background doping, the punchthrough implant provides the channel with greater robustness to punchthrough voltages by laterally widening of the drain-depletion region below the top surface of the substrate, and the threshold voltage implant shifts the threshold voltage towards a desired value such as 0.4 to 0.7 volts. Typically the threshold adjust implant has a peak concentration near the top surface of the substrate, the punchthrough implant has a peak concentration near the bottom of the source and drain regions, the well implant has a peak concentration below the source and drain regions.

Figure 1B:
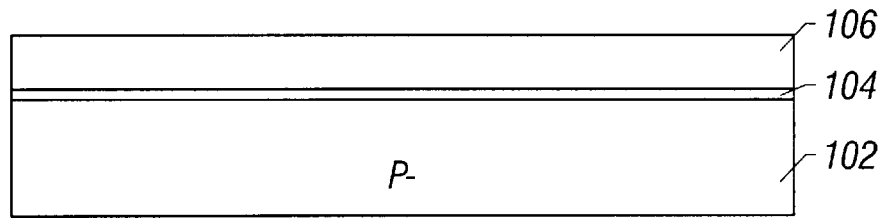

In FIG. 1B, a blanket layer of gate oxide 104, composed of silicon dioxide (SiO$_2$), is grown on the top surface of active region 102 using tube growth at a temperature of 700 to 1000° C. in an O$_2$ containing ambient. Gate oxide 104 has a thickness of about 50 angstroms. Thereafter, a blanket layer of undoped polysilicon 106 is deposited by low pressure chemical vapor deposition (LPCVD) on the top surface of gate oxide 104. Polysilicon layer 106 has a thickness of about 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 10 kiloelectron-volts. However, it is generally preferred that polysilicon 106 be initially doped at a later step, as described below.

Figure 1C:
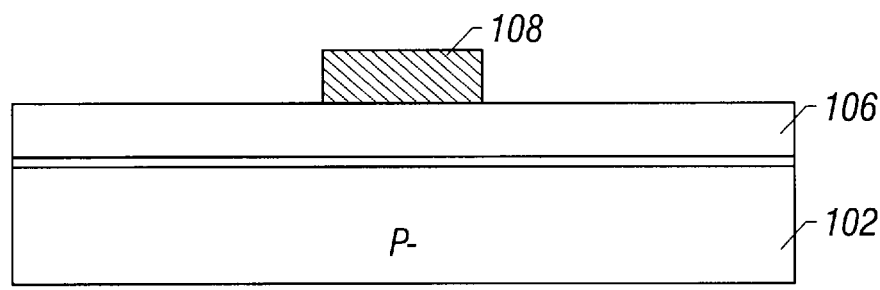

In FIG. 1C, photoresist layer 108 is deposited on polysilicon 106 and patterned to selectively expose polysilicon 106. Photoresist layer 108 is patterned using a photolithographic system, such as a step and repeat optical projection system, in which deep ultraviolet light from a mercury-vapor lamp is projected through a first reticle and a focusing lens to obtain a first image pattern. For illustration purposes, the minimum resolution of the photolithographic system is about 3500 angstroms (0.35 microns). Thereafter, photoresist layer 108 is developed and the irradiated portions are removed so that photoresist layer 108 has a length (or linewidth) of about 3500 angstroms above active region 102. The openings in photoresist layer 108 expose portions of polysilicon 106, thereby defining a gate.

Figure 1D:
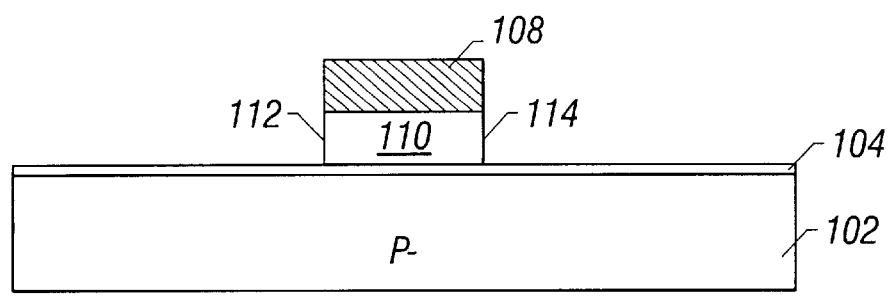

In FIG. 1D, an anisotropic dry etch is applied using photoresist layer 108 as an etch mask. Photoresist layer 108 protects the underlying regions of polysilicon 106, and the etch removes the regions of polysilicon 106 beneath the openings in photoresist layer 108. The etch is highly selective of polysilicon with respect to silicon dioxide, so only a negligible amount of gate oxide 104 beneath the openings in photoresist layer 108 is removed and the substrate is unaffected. The etch forms polysilicon gate 110 from the unetched portion of polysilicon 106 over active region 102. Gate 110 has opposing vertical sidewalls 112 and 114 separated by a length of about 3500 angstroms, and a thickness (or height above the underlying gate oxide 104) of about 2000 angstroms.

Figure 1E:
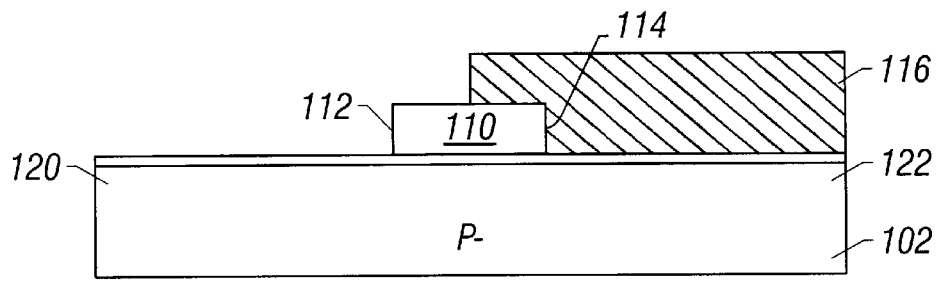

In FIG. 1E, photoresist layer 108 is removed, and photoresist layer 116 is deposited over the substrate. The photolithographic system uses a second reticle to irradiate photoresist layer 116 with a second image pattern, the irradiated portions of photoresist layer 116 are removed, photoresist layer 116 includes an opening above source region 120 of active region 102 and a first portion of gate 110 that includes sidewall 112, and photoresist layer 116 covers drain region 122 of active region 102 and a second portion of gate 110 that includes sidewall 114.

Figure 1F:
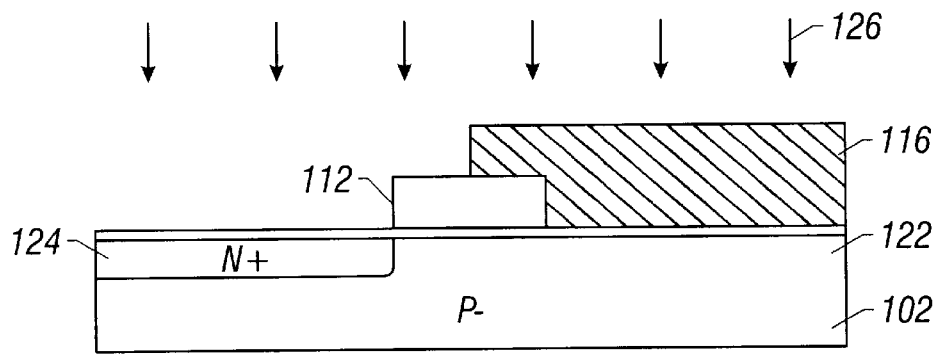

In FIG. 1F, heavily doped source region 124 is implanted into source region 120 by subjecting the structure to ion implantation of arsenic, indicated by arrows 126, at a dose in the range of $2\times10^5$ to $4.5\times10^{15}$ atoms/cm$^2$ and a low implant energy of 2 to 10 kiloelectron-volts, using the first portion of gate 110 (exposed by photoresist layer 116) and photoresist layer 116 as an implant mask for active region 102. As a result, heavily doped source region 124 is substantially aligned with sidewall 112 and forms a shallow channel junction, and drain region 122 is essentially unaffected. Heavily doped source region 124 is doped N+ with an arsenic concentration in the range of about $1\times10^{18}$ to $1\times10^{20}$ atoms/cm$^3$, and drain region 122 remains doped P-.

Figure 1G:
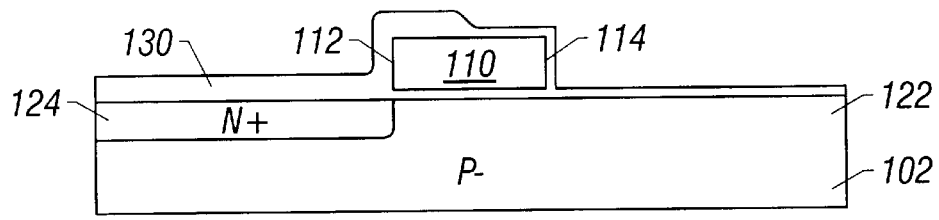

In FIG. 1G, photoresist layer 116 is removed, and oxide layer 130 is differentially grown over active region 102 using tube growth at a temperature of 700 to 1000° C. in an O$_2$ containing ambient. Oxide layer 130 grows more rapidly and therefore has a greater thickness over heavily doped source region 124 than over drain region 122 due to the greater concentration of arsenic in heavily doped source region 124 than in drain region 122. Likewise, oxide layer 130 grows more rapidly and therefore has a greater thickness over the first portion of gate 110 (that includes sidewall 112) than over the second portion of gate 110 (that includes sidewall 114) due to the greater concentration of arsenic in the first portion of gate 110 than in the second portion of gate 110. Accordingly, oxide layer 130 has a thick portion, with a thickness of about 400 angstroms, over heavily doped source region 124 and the first portion of gate 110, where the arsenic was implanted, and oxide layer 130 has a thin portion, with a thickness of about 100 angstroms, over drain region 122 and the second portion of gate 110, where the arsenic was blocked by photoresist layer 116.

The thermal oxidation rate of silicon is a function of various parameters, including the crystallographic orientation of the silicon, the silicon doping concentration, the presence of halogen impurities (Cl, HCl, TCA, TCE) in the gas phase, the growth pressure, the presence of plasma during growth, and the presence of photon flux during growth. A high doping concentration in the silicon can significantly enhance the oxidation rate. For example, in NPN bipolar emitters and NMOS sources and drains, the oxidation growth rates may be as much as five times higher over the heavily doped regions than they are over lightly doped regions. Such higher oxidation rates have been attributed to the increase in total silicon substrate vacancy concentrations, with the vacancies at the Si/SiO$_2$ interface assumed to act as sites for the oxidation reaction.

Figure 1H:
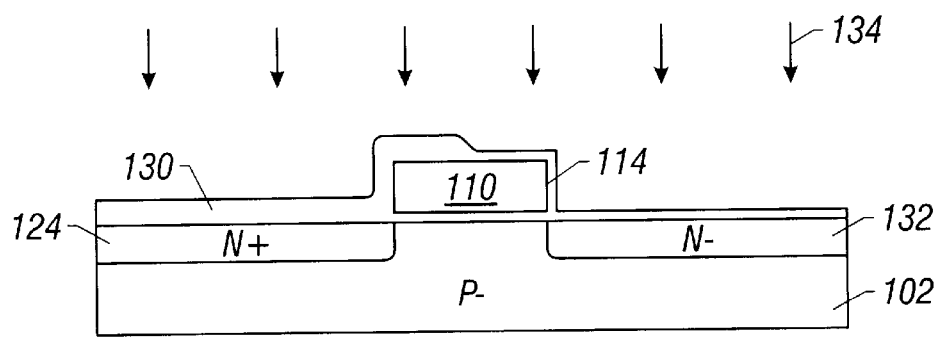

In FIG. 1H, lightly doped drain region 132 is implanted into drain region 122 by subjecting the structure to ion implantation of phosphorus, indicated by arrows 134, at a dose in the range of $1 \times 10^{13}$ to $5 \times 10^{14}$ atoms/cm$^2$ and a low implant energy of about 2 to 10 kiloelectron-volts, using oxide layer 130 as an implant mask for heavily doped source region 124 and the first portion of gate 110, and using the second portion of gate 110 and the vertical portion of oxide layer 130 adjacent to sidewall 114 as an implant mask for the underlying region of active region 102, but without using oxide layer 130 (other than the vertical portion adjacent to sidewall 114) as an implant mask for drain region 122. In other words, essentially all of the phosphorus ions that impinge upon the thick horizontal portions of oxide layer 130 are blocked, whereas essentially all of the phosphorus ions that impinge upon the thin horizontal portions of oxide layer 130 pass through to the underlying materials. As a result, lightly doped drain region 132 is substantially aligned with the vertical portion of oxide layer 130 adjacent to sidewall 114 and forms a shallow channel junction, and heavily doped source region 124 is essentially unaffected. Lightly doped drain region 132 is doped N- with a phosphorus concentration in the range of about $1 \times 10^{17}$ to $1 \times 10^{18}$ atoms/cm$^3$, and heavily doped source region 124 remains doped N+.

Figure 1I:
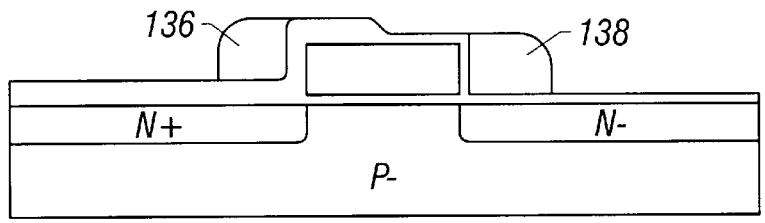

In FIG. 1I, a blanket layer of silicon nitride (Si$_3$N$_4$) with a thickness of 1500 angstroms is conformally deposited over the exposed surfaces by plasma enhanced chemical vapor deposition (PECVD) at a temperature in the range of 200 to 400° C. Thereafter, the entire silicon nitride layer is subjected to an anisotropic etch, such as a reactive ion etch, that is highly selective of silicon nitride with respect to silicon dioxide, and therefore has no appreciable affect on oxide layer 130 or the underlying materials. The anisotropic etch forms nitride spacers 136 and 138 over heavily doped source region 124 and lightly drain region 132, respectively, and in close proximity to sidewalls 112 and 114, respectively, from the unetched portions of the nitride layer. Spacers 136 and 138 have essentially identical sizes, however, spacer 136 is higher than spacer 138, and the distance between spacer 136 and sidewall 112 is larger than the distance between spacer 138 and sidewall 114, due to the differential thickness of oxide layer 130.

Figure 1J:
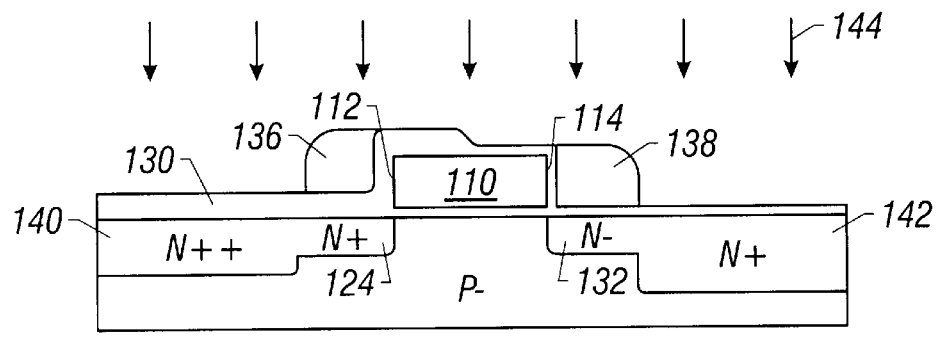

In FIG. 1J, ultra-heavily doped source region 140 and heavily doped drain region 142 are implanted into source region 120 and drain region 122, respectively, outside spacers 136 and 138, respectively, by subjecting the structure to ion implantation of arsenic, indicated by arrows 144, at a dose in the range of $1 \times 10^{15}$ to $5 \times 10^{15}$ atoms/cm$^2$ and a high implant energy of 60 to 80 kiloelectron-volts, using the gate 110, the vertical portions of oxide layer 130 adjacent to sidewalls 112 and 114, and nitride spacers 136 and 138 as an implant mask for active region 102, but without using oxide layer 130 (other than the vertical portions adjacent to sidewalls 112 and 114) as an implant mask for active region 102. In other words, essentially all of the arsenic ions that impinge upon the horizontal portions of oxide layer 130 (whether thick or thin) pass through to the underlying materials. As a result, ultra-heavily doped source region 140 and heavily doped drain region 142 are substantially aligned with the edges of nitride spacers 134 and 136, respectively, opposite to sidewalls 112 and 114, respectively. Ultra-heavily doped source region 140 is doped N++ with an arsenic concentration in the range of about $1.5 \times 10^{19}$ to $1 \times 10^{21}$ atoms/cm$^3$, and heavily doped drain region 142 is doped N+ with an arsenic concentration in the range of about $1 \times 10^{18}$ to $1 \times 10^{20}$ atoms/cm$^3$. Furthermore, the portion of heavily doped source region 124 beneath nitride spacer 136 and the vertical portion of oxide layer 130 adjacent to sidewall 112 is essentially unaffected and remains doped N+, and the portion of lightly doped drain region 132 beneath nitride spacer 138 and the vertical portion of oxide layer 130 adjacent to sidewall 114 is essentially unaffected and remains doped N-.

As is seen, the depths of ultra-heavily doped source region 140 and heavily doped drain region 142 are greater than the depths of heavily doped source region 124 and lightly doped drain region 132, and ultra-heavily doped source region 140 and heavily doped drain region 142 are displaced from the channel junctions provided by heavily doped source region 124 and lightly doped drain region 132. Furthermore, ultra-heavily doped source region 140 has a smaller depth than heavily doped drain region 142 due to the differential thickness of oxide layer 130.

Figure 1K:
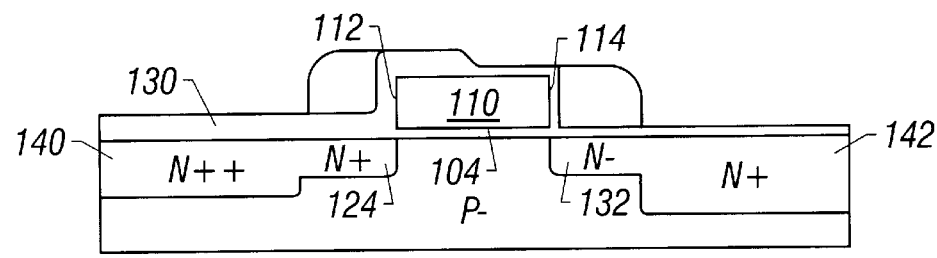

In FIG. 1K, and the device is annealed to remove crystalline damage and to drive-in and activate the implanted dopants by applying a rapid thermal anneal on the order of 950 to 1050° C. for 10 to 30 seconds. As a result, an N-channel IGFET is formed with a source (consisting of heavily and ultra-heavily doped source regions 124 and 140) in the source region and a drain (consisting of lightly and heavily doped drain regions 132 and 142) in the drain region. The IGFET is controlled by gate 110.

During high-temperature processing, phosphorus tends to diffuse far more rapidly than arsenic in single crystal silicon. As a result, lightly doped drain region 132 diffuses farther than heavily doped source region 124, ultra-heavily doped source region 140, or heavily doped drain region 142. Advantageously, the channel junction provided by heavily doped source region 124 remains substantially aligned with sidewall 112, and the channel junction provided by lightly doped drain region 132 diffuses beneath the vertical portion of oxide layer 130 adjacent to sidewall 114 to become substantially aligned with sidewall 114.

In polysilicon, the diffusion constants at the grain boundaries are significantly higher than those in the single crystal regions. Thus, during high-temperature processing the dopants diffuse much more rapidly along the grain boundaries than through the crystallites. As a result, the arsenic and phosphorus in gate 110 tend to redistribute and provide a relatively uniform doping concentration in gate 110. Advantageously, no appreciable amount of arsenic or phosphorus in gate 110 diffuses through gate oxide 104 into active region 102, thereby assuring that the IGFET is an enhancement-mode device.

Figure 1L:
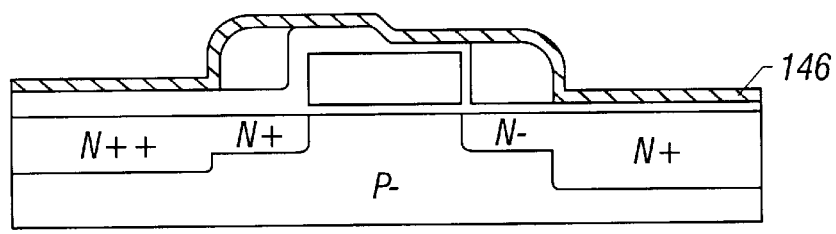

In FIG. 1L, titanium layer 144 with a thickness of about 200 angstroms is sputter deposited over the substrate.

Figure 1M:
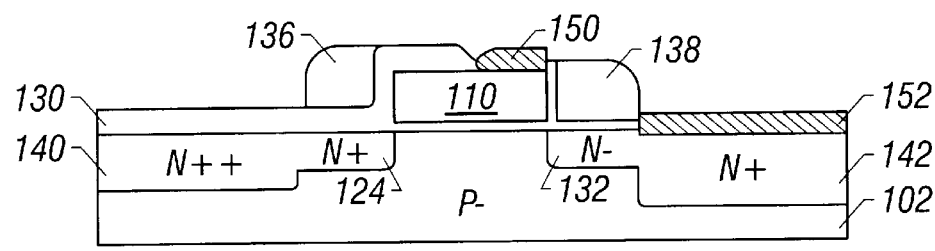

In FIG. 1M, a rapid thermal anneal on the order of 700° C. for 30 seconds is applied in a nitrogen ambient to convert portions of titanium layer 144 over the second portion of gate 110 and heavily doped drain region 142 into titanium silicide contacts 150 and 152, respectively. It is noted that about 350 angstroms of oxide between the titanium and the underlying silicon is sufficiently thick to prevent the silicide reaction from occurring. Accordingly, the thick portions of oxide layer 130 are thicker than 350 angstroms, and the thin portions of oxide layer 130 are thinner than 350 angstroms. Furthermore, nitride spacers 136 and 138 protect heavily doped source region 124 and lightly doped drain region 132, respectively, from the silicide reaction. Thus, the silicide reaction occurs with the second portion of gate 110 and heavily doped drain region 142, but does not occur elsewhere over active region 102. Thereafter, the unreacted titanium (including titanium nitride) is stripped, and a subsequent anneal at 750 to 800° C. for 30 seconds is applied to lower the resistivity of titanium silicide contacts 150 and 152. Titanium silicide contacts 150 and 152 have a thickness of about 400 angstroms and are separated from one another. Although titanium silicide contact 150 is formed only on the second portion of gate 110, it contacts a sufficiently large region of gate 110 to provide a low resistance ohmic contact. Moreover, the thick portion of oxide layer 130 over ultra-heavily doped source region 140 prevents any titanium silicide from forming on ultra-heavily doped source region 140. Of importance, no titanium silicide is formed on the source.

Several advantages of the first embodiment can be appreciated.

First, the asymmetrical IGFET includes a source that need not accommodate the silicide reaction that forms a silicide contact on the drain, thereby facilitating forming the source with the desired dimensions and doping profile.

Second, the heavily doped source region which provides the source-side channel junction is doped with arsenic (without phosphorus), and the lightly doped drain region which provides the drain-side channel junction is doped with phosphorus (without arsenic). It is often desirable to minimize the amount of diffusion by the channel junctions. Although phosphorus tends to diffuse far more rapidly than arsenic in single crystal silicon during high-temperature steps, a phosphorus-based lightly doped drain region may provide better protection against hot carrier effects than an arsenic-based lightly doped drain region. Therefore, doping the heavily doped source region with arsenic and the lightly doped drain region with phosphorus provides a desirable tradeoff.

Third, the heavily doped source region is implanted with arsenic while the source-side sidewall of the gate is exposed, whereas the lightly doped drain region is implanted with phosphorus while the drain-side sidewall of the gate is covered by a vertical portion of the oxide layer. Therefore, the more rapid diffusion of the lightly doped drain region with respect to the heavily doped source region is offset by implanting the lightly doped drain region slightly further from the gate than the heavily doped source region is implanted from the gate. This facilitates precise alignment of both channel junctions with the sidewalls of the gate after the drive-in steps.

Fourth, the lightly doped drain region is implanted after the oxide layer is differentially grown. As a result, the phosphorus-based lightly doped drain region need not be subjected to a lengthy thermal growth step that might otherwise cause excessive diffusion.

Fifth, the photoresist layer that provides the implant mask as the heavily doped source region is implanted determines how much of the gate is exposed to the implantation. That is, the photoresist layer can cover substantially all of the gate, substantially none of the gate, or various amounts in between. Since the doping concentration in the gate affects the threshold voltage, the photoresist layer can be used to adjust the threshold voltage. For instance, it may be desirable for IGFETs in critical speed paths to have a lower threshold voltage, and therefore higher drive current and off-state leakage current, than other IGFETs in the circuit.

Sixth, the differentially grown oxide layer protects the source from the silicide reaction without protecting the drain from the silicide reaction, thereby providing a selective silicidation process without the need for an additional photolithography and etch step.

Other embodiments of the present invention are described below. Unless otherwise noted, the elements for these embodiments are similar to elements of the first embodiment, and the description of related elements and process steps need not be repeated.

In a second embodiment of the invention, the implant energy of the second arsenic implant (indicated by arrows 144) can be reduced (or alternatively, the thickness of oxide layer 130 can be increased) so that the second arsenic implant does not provide doping for the source region. In this manner, the first arsenic implant (indicated by arrows 126) provides all N-type doping for the source, and the source consists of the heavily doped source region 124.

In a third embodiment of the invention, oxide layer 130 can be briefly etched to expose the drain (outside nitride spacer 138) without exposing any portion of the source. Thereafter, a refractory metal (such as titanium 144) can be deposited on the drain without being deposited on the source. This can facilitate forming the silicide contact on the drain. For instance, if the refractory metal is cobalt, it may be essential that little or no oxide remain between the cobalt and the drain before the silicide reaction occurs in order to properly form a cobalt silicide contact on the drain.

In a fourth embodiment of the invention, the nitride spacers are not formed. In this instance, it is preferable that oxide layer 130 over the drain region be as thick as possible while allowing the silicide reaction to occur in order to maximize the lateral size of the lightly doped drain region after the second arsenic implant (indicated by arrows 144) forms the heavily doped drain region.

In a fifth embodiment of the invention, the phosphorus implant (indicated by arrows 134) is provided after forming the gate, but before forming photoresist layer 116, using only the gate as an implant mask for the active region, in order to form lightly doped source and drain regions substantially aligned with the sidewalls of the gate. In this instance, growing oxide layer 130 would cause the channel junctions on both the source-side and the drain side to diffuse substantially beneath the sidewalls of the gate. The overlap between the channel junctions and the gate leads to capacitive effects (known as "Miller capacitance") that tend to reduce switching speeds, however decreasing the channel length increases drive current. Therefore, the overlap between the gate and the channel junctions involves a tradeoff between switching speed and drive current.

The present invention provides an asymmetrical IGFET with a silicide contact on the drain without a silicide contact on the source. Preferably, a heavily doped source region and a lightly doped drain region provide the channel junctions, and an ultra-heavily doped source region and a heavily doped drain region are displaced from the channel junctions. It is also preferred that the source consists of the heavily and ultra-heavily doped source regions, and the drain consists of the lightly and heavily doped drain regions.

By definition, the dopant concentration of the ultra-heavily doped source region exceeds that of the heavily doped source and drain regions, and the dopant concentration of the heavily doped source and drain regions exceeds that of the lightly doped drain region. Preferably, the dopant concentration of the ultra-heavily doped source region is in the range of 1.5 to 10 times that of the heavily doped source and drain regions, and the dopant concentration of the heavily doped source and drain regions is in the range of 10 to 100 times that of the lightly doped drain region. Of course, the heavily doped source and drain regions need not have identical doping concentrations.

Further processing steps in the fabrication of IGFETs typically include forming a thick oxide layer over the active regions, forming contact windows (or vias) in the oxide layer to expose the silicide contacts and/or source and drain, forming conductive plugs in the contact windows, and forming a metal-1 pattern on the thick oxide layer that selectively interconnects the plugs. Thereafter, more inter-level dielectrics with conductive plugs and additional metallization patterns (such as metal-2 through metal-5) can be formed. In addition, subsequent high-temperature process steps can be used to supplement or replace the anneal steps to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiments described above. For instance, various aspects of the embodiments can be combined with others. The well, punchthrough and threshold adjust implants may not be essential, and various doping profiles for the source and drain can be used. The differentially grown oxide layer can be grown on the source and drain regions either with or without the gate oxide on the source and drain regions.

The gate can be various conductors, the gate insulator can be various dielectrics, and the spacers can be various dielectrics such as silicon nitride and silicon oxynitride that can selectively etched with respect to silicon dioxide. Suitable refractory metals for forming the silicide contacts include titanium, tungsten, molybdenum, cobalt and tantalum. Other masking layers besides photoresist can be used, such as silicon nitride patterned using photolithography. The conductivity types can be reversed. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a single N-channel device has been shown for purposes of illustration, it is understood that in actual practice, many devices are fabricated on a single semiconductor wafer as is widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are with the scope of the invention. Variations and modifications of the embodiments disclosed herein may be made based on the description set forth herein, without departing from the scope and spirit of the invention as set forth in the following claims.

What is claimed is:

1. A method of making an asymmetrical IGFET, comprising:

providing a semiconductor substrate with an active region, wherein the active region includes a source region and a drain region;

forming a gate oxide on the active region;

forming a polysilicon gate with first and second opposing sidewalls on the gate oxide and over the active region;

forming a photoresist layer that covers the drain region and includes an opening above the source region;

implanting arsenic into the source region without implanting arsenic into the drain region during a first implant step using the photoresist layer as an implant mask, thereby providing a heavily doped source region in the source region;

stripping the photoresist layer;

growing an oxide layer over the active region, wherein the oxide layer has a greater thickness over the source region than over the drain region due to a greater concentration of arsenic in the source region than in the drain region;

implanting phosphorus into the drain region without implanting phosphorus into the source region during a second implant step using the oxide layer as an implant mask for all of the source region without using the oxide layer as an implant mask for most of the drain region due to the greater thickness of the oxide layer over the source region than over the drain region, thereby providing a lightly doped drain region in the drain region;

depositing a conformally layer of spacer material on the oxide layer;

applying an anisotropic etch to form first and second spacers from unetched portions of the spacer material on the oxide layer, wherein the first spacer is over the source region and the second spacer is over the drain region;

implanting a heavily doped drain region into the drain region outside the second spacer during a third implant step;

forming a source in the source region and a drain in the drain region, wherein the source includes the heavily doped source region and an ultra-heavily doped source region and the drain includes the lightly and heavily doped drain regions, wherein the heavily doped source region provides a first channel junction, and the lightly doped drain region provides a second channel junction;

depositing a refractory metal over the gate, the source, the drain, and the oxide layer; and applying a thermal cycle that reacts the refractory metal with the drain without reacting the refractory metal with the source due to the oxide layer having a greater thickness over the source region than over the drain region, thereby forming a silicide contact on the drain without forming a silicide contact on the source.

2. The method of claim 1, wherein the silicide contact on the drain is aligned with the second spacer.

3. The method of claim 1, including:

applying an anisotropic etch to all of the oxide layer that removes a portion of the oxide layer, thereby exposing the drain region without exposing the source region; and then depositing the refractory metal on the drain region without depositing the refractory metal on the source region.

4. The method of claim 1, including:

depositing the refractory metal on the oxide layer without depositing the refractory metal on the active region; and applying the thermal cycle to consume all of the oxide layer above a portion of the drain region without consuming all of the oxide layer above any portion of the source region.

5. The method of claim 1, wherein the oxide layer is at least twice as thick over the source region and a first portion of the gate that includes the first sidewall than over the drain region and a second portion of the gate that includes the second sidewall.

6. The method of claim 1, wherein the spacers are selected from the group consisting of silicon nitride and silicon oxynitride.

7. The method of claim 1, wherein the steps are performed in the sequence set forth.

* * * * *